United States Patent [19]

Etienne

[11] 4,272,716
[45] Jun. 9, 1981

[54] DEVICE FOR SIMULATING THE OPERATION OF AN ACCUMULATOR BATTERY, IN PARTICULAR A TRACTION BATTERY FOR AN ELECTRIC VEHICLE

[75] Inventor: Michel Etienne, Valmondois, France

[73] Assignees: Automobiles Peugeot; Societe Anonyme Automobiles Citroen, both of Paris, France

[21] Appl. No.: 20,444

[22] Filed: Mar. 14, 1979

[30] Foreign Application Priority Data

Mar. 29, 1978 [FR] France ................................. 78 09150

[51] Int. Cl.$^3$ .............................................. H02J 7/00
[52] U.S. Cl. ...................................... 320/14; 320/48; 320/59; 363/27
[58] Field of Search .................. 320/2, 13, 14, 48, 61, 320/57, 59; 363/27, 37; 318/139; 307/46, 48

[56] References Cited

U.S. PATENT DOCUMENTS

| 3,663,938 | 5/1972 | Baer | 320/48 |
| 3,950,689 | 4/1976 | Jamison | 307/46 X |
| 4,065,711 | 12/1977 | Kawabata | 320/14 |

FOREIGN PATENT DOCUMENTS

| 1671821 | 5/1970 | Fed. Rep. of Germany | 320/14 |
| 547913 | 11/1975 | U.S.S.R. | 320/14 |

Primary Examiner—Robert J. Hickey
Attorney, Agent, or Firm—Burns, Doane, Swecker & Mathis

[57] ABSTRACT

This device comprises a rectifier-inverter supplied with current by the mains and adapted to deliver a charging current to the battery in the course of the charging periods of the battery and to restore to the mains the discharge current of the battery in the course of the discharging periods of the battery, a direct current chopper for chopping the current of the battery at an available conduction rate in the course of the simulation of the cycle of operation, a switch connected between the rectifier-inverter and the chopper and circuits for automatically controlling the chopper, the switch and the rectifier-inverter as a function of the cycle of operation of the battery to be simulated.

16 Claims, 11 Drawing Figures

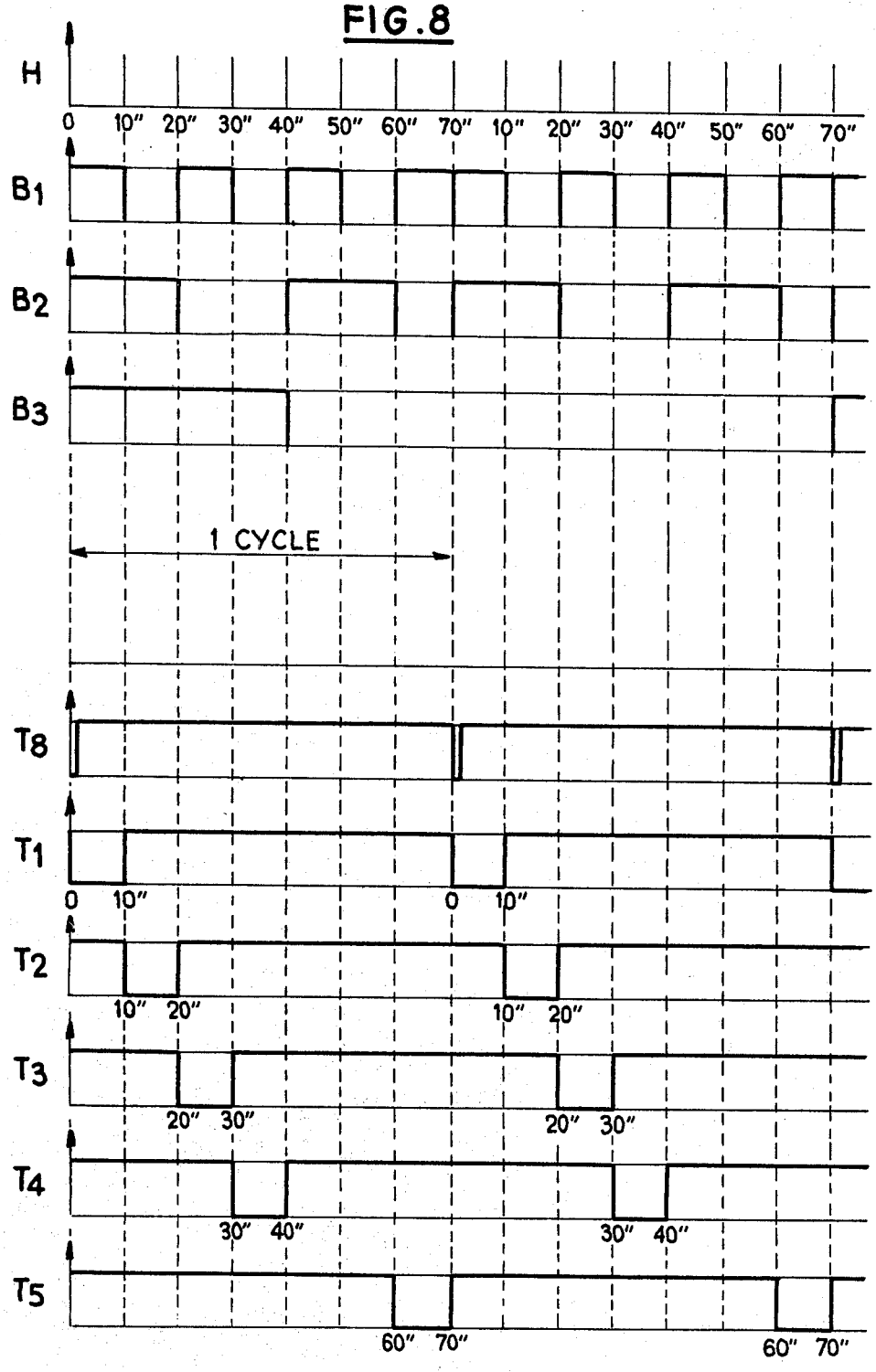

DEVICE FOR SIMULATING THE OPERATION OF AN ACCUMULATOR BATTERY, IN PARTICULAR A TRACTION BATTERY FOR AN ELECTRIC VEHICLE

DESCRIPTION

The present invention relates to batteries, in particular traction batteries for automobile vehicles, and relates more particularly to a simulator of the operation of such an accumulator battery.

The development of accumulator batteries for electric vehicles requires means for systematically measuring the duration of these batteries placed under their real conditions of use.

When the measurements relating to the operations of such batteries are carried out while the battery is placed on an actual vehicle employed for normal traffic circulation, they can only constitute a checking of the behaviour of the battery with respect to time since traffic circulation in a town is determined more by the intensity of traffic than by the actions of the driver.

The object of the invention is to remedy the aforementioned drawbacks by providing an automatic simulator of the operation of a traction accumulator battery on an automobile vehicle.

This simulator is adapted to reproduce the operation of a battery on the vehicle when driving and when braking with recovery of energy up to an acceptable discharge of the battery. It is moreover adapted to ensure the recharging of the battery under given conditions, before a new discharge, the operation of the unit being continuous until the battery is put out of service. The device is moreover designed to place the battery under mechanical conditions which are similar to the actual conditions on an automobile vehicle.

According to the invention, there is provided a device for simulating the operation of an accumulator battery comprising an electric supply device connected to a source of alternating current, wherein said supply device is formed by a rectifier-inverter supplied with current by said source and adapted to deliver the charging current to the battery during the charging periods of the battery and restore to said source the discharging current of the battery in the discharging periods of the battery, the simulating device further comprising a direct current chopper adapted to chop at a variable conduction rate the current received by the battery or delivered by the battery in the course of the simulation of an operational cycle of the battery and a switch connected between the rectifier-inverter and the chopper circuit to produce the passage of a charging current from the rectifier-inverter to the battery in the course of charging periods of the battery, and the passage of a discharging current from the battery to the rectifier-inverter and the source during the discharging periods of the battery.

Further features of the invention will be apparent from the ensuing description with reference to the accompanying drawings which are given solely by way of example and in which:

FIG. 8 is a diagram of the signals of the various elements of the time base circuit of FIG. 7;

In the ensuing description, the simulator according to the invention will be considered in the case of the carrying out of the autonomous cycle of a traction battery defined by the International Electronic Commission, termed the "Stockholm cycle", in which the following conditions must be satisfied:

Acceleration of the vehicle to 50 k.p.h., (mean acceleration of 1.5 m/sec./sec.), speed on the level, braking (deceleration of $-1.5$ m/sec./sec.), stoppage during 30 seconds, the distance travelled through being 400 m per cycle of 70 seconds.

Figure 1:
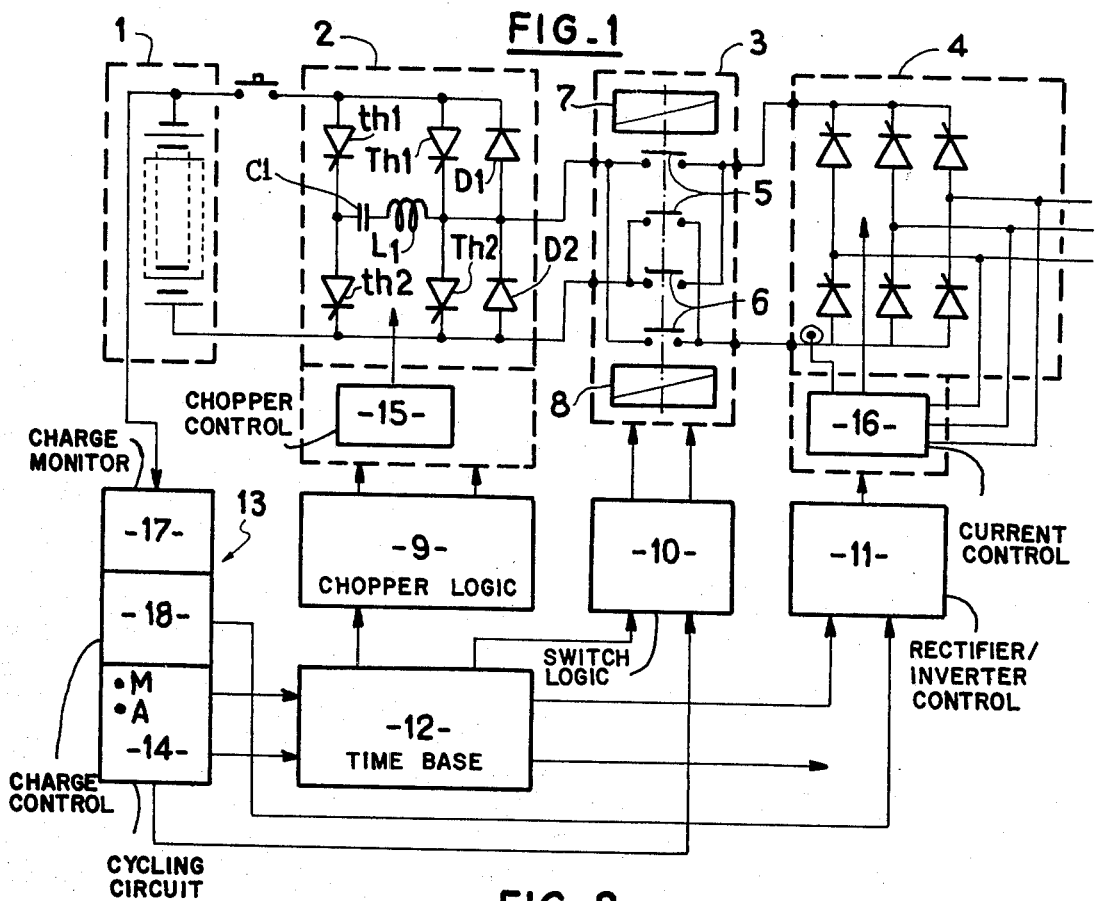
FIG. 1 is a synoptic schematic of a simulator of the operation of a traction battery for electric vehicles according to the invention.

The simulator of the operation of an accumulator battery shown in FIG. 1 comprises mainly, connected to the terminals of the battery 1 to be studied, a direct current chopper 2, itself connected through a controlled switch 3 to a rectifier-inverter 4 supplied with current by the three-phase mains or line. The chopper 2 is a circuit of the type currently employed on electric vehicles for adapting the voltage of the motor to the fixed voltage of the battery. In the present embodiment, the chopper 2 comprises two pairs of thyristors Th1, Th2, and th1, th2 respectively connected in series to the terminals of the battery 1, the junction points of the thyristors Th1, Th2 and th1, th2 being connected to each other through a circuit comprising a capacitor C1 and an inductor L1.

Connected to the terminals of the aforementioned thyristors are two diodes D1, D2 in series, the cathode of the diode D1 being connected to the anodes of the thyristors th1, Th1, whereas the anode of the diode D2 is connected to the cathodes of the thyristors th2, Th2. The junction point of the diodes D1 and D2 is connected to the junction point of the thyristors Th1, Th2. The chopper 2 just described is connected to the switch 3 which, in the presently-described embodiment, is an electromechanical reversing switch comprising two coupled pairs of contacts 5, 6 respectively controlled by relays 7, 8. The moving contacts 5 and 6 cooperate respectively with the corresponding fixed contacts the closure of which ensures the inversion of the direction of the current applied to the terminals of the diode D2 of the chopper 2. Such an electromechanical switch is conventional in circuits controlling electric motors and it may be easily constructed in the form of a semi-conductor circuit. Two fixed input contacts of the switch 3 are connected to the output of the rectifier-inverter 4. In the presently described embodiment, this rectifier-inverter is a conventional synchronous rectifier-inverter currently employed industrially. It is a rectifier-inverter having a six-phase bridge including six thyristors controlled by a current which is governed by a set reference value. It is connected to the three-phase mains or line.

The simulator shown in FIG. 1 further comprises a number of means for controlling the circuits 2, 3 and 4 so as to permit the obtainment of a succession of simulated town circulation cycles until discharge of the battery 1, then the recharging of the latter under set conditions before going on to the carrying out of the cycles of operation. Among these control elements, there are:

a logic circuit 9 controlling the chopper 2;
a logic circuit 10 controlling the switch 3;
a circuit 11 controlling the rectifier-inverter 4;
a general time base;
a control unit 13 supervising the state of charge of the battery 1;
a circuit 4 controlling the cycling.

The logic circuit 9 controlling the chopper is connected to the chopper 2 through a chopper control circuit 15.

Associated with the rectifier-inverter 4 is a current control circuit 16.

The unit 13 supervising the state of charge of the battery comprises a circuit 17 supervising the state of charge and a circuit 18 controlling the recharging of the battery.

The output of the circuit 18 is connected to an input of the circuit 11 controlling the rectifier-inverter.

The circuit controlling the cycling 14 comprises a start-stop output connected to an input of the time base circuit 12 and a clock output connected to another input of this time base circuit. The time base circuit 12 comprises a first output connected to the input of the logic circuit 9 controlling the chopper, a second output connected to an input of the logic circuit 10 controlling the inverter, a third output connected to an input of the circuit 11 controlling the rectifier-inverter and a fourth input controlling means (not shown) for mechanically vibrating the battery.

The logic circuit 10 controlling the switch 3 comprises a second input connected to an additional output of the cycling circuit 14.

Figure 4:
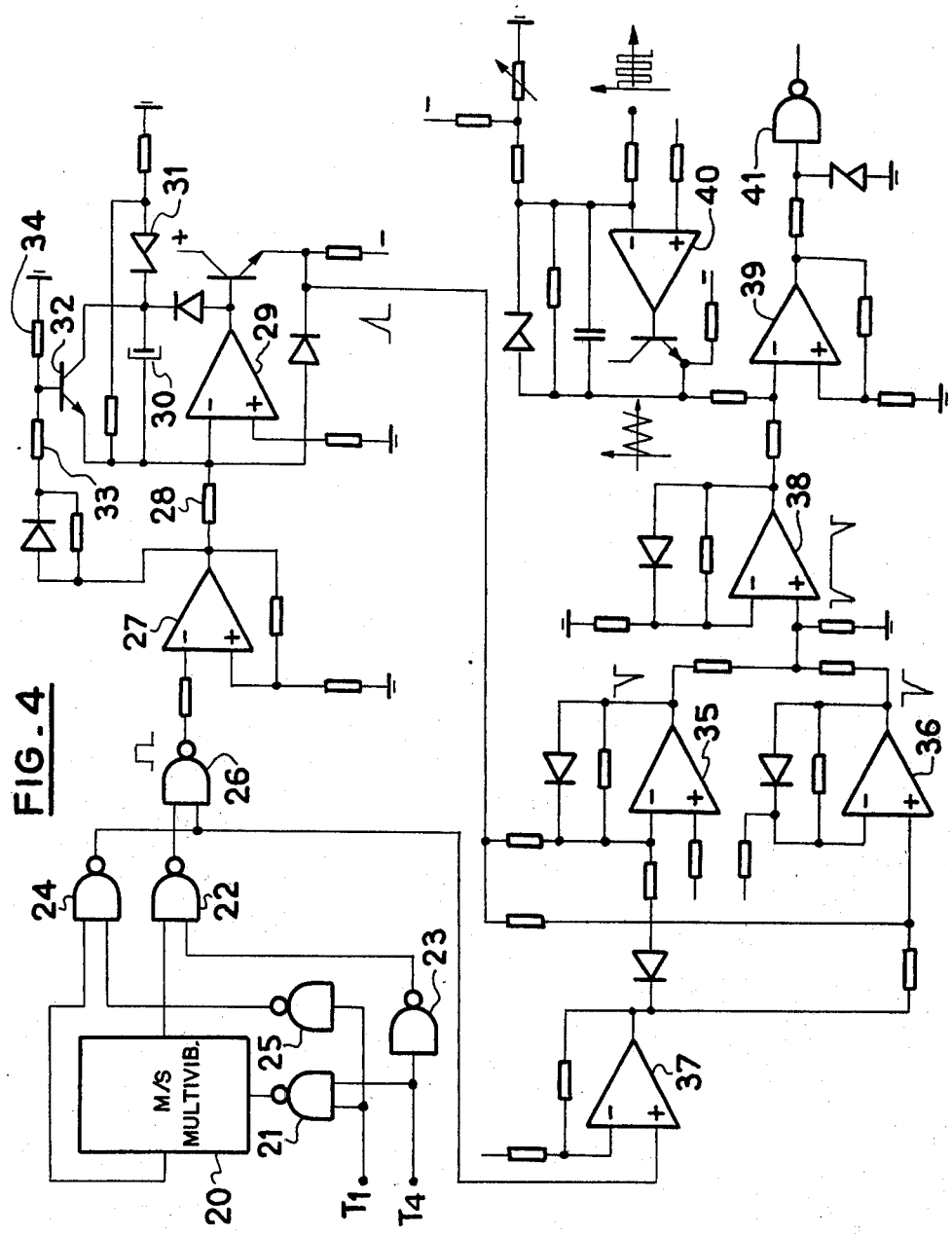
FIG. 4 is a detailed schematic of the circuit controlling the chopper of the circuit of FIG. 1.

The chopper control logic circuit 9 is shown in FIG. 4.

The comprises a monostable circuit 20 whose input is connected through an inverting AND gate 21 to a traction output T1 and to a braking output T4 of the time base circuit 12. An output of the monostable circuit 20 is connected to an input of an inverting AND gate 22 the other input of which is connected to the terminal T4 through an inverter 23. The other output of the monostable circuit 20 is connected to an input of an inverting AND gate 24 the other input of which is connected to the terminal T1 through an inverter 25. The outputs of the gates 22 and 24 are connected to corresponding inputs of an inverting AND gate 26 whose output is connected to a negative terminal of an operational amplifier 27 adapted to deliver at its output a positive or negative current ±15 V for example, in phase opposition with the input pulse. The output of the amplifier 27 is connected, through a resistor 28, to an input of the operational amplifier 29 which comprises in its feedback circuit a capacitor 30. Associated with the amplifier 29 is a voltage limiting Zener diode 31 connected between the terminal of the capacitor 30 opposed to the resistor 28 and earth. Connected in parallel to the capacitor 30 is the emitter-collector path of a transistor 32 whose base is connected to the output of the operational amplifier 27 through a voltage divider 33, 34. The output of the operational amplifier 29 is connected to the negative and positive inputs of amplifiers 35 and 36 respectively. These same inputs are moreover connected to the output of a switching circuit 37 controlled by the monostable circuit 20. The operational amplifier 35 is adapted to invert the input function in such manner that there appears at its output a voltage which varies linearly between 0 and a given negative value, for example −10 V, whereas the amplifier 36 is adapted to deliver the symmetrical function so that there appears at its output a voltage which varies linearly from said negative value to 0 V. The outputs of the amplifiers 35 and 36 are connected to an input of a summing amplifier 38 whose output is connected to an input of a comparator 39 to which is also connected a sawtooth signal generator 40 the amplitude of which signals is equal to the value of the currents delivered by the amplifiers 35 and 36 whereas the frequency is equal to a predetermined value, for example 200 Hz. The output of the comparator 39 is connected to a gate 41 which is adapted to deliver a signal controlling the chopper 2 and is connected to the control electrodes of the thyristors Th1 and Th2 of this chopper.

Figure 5:
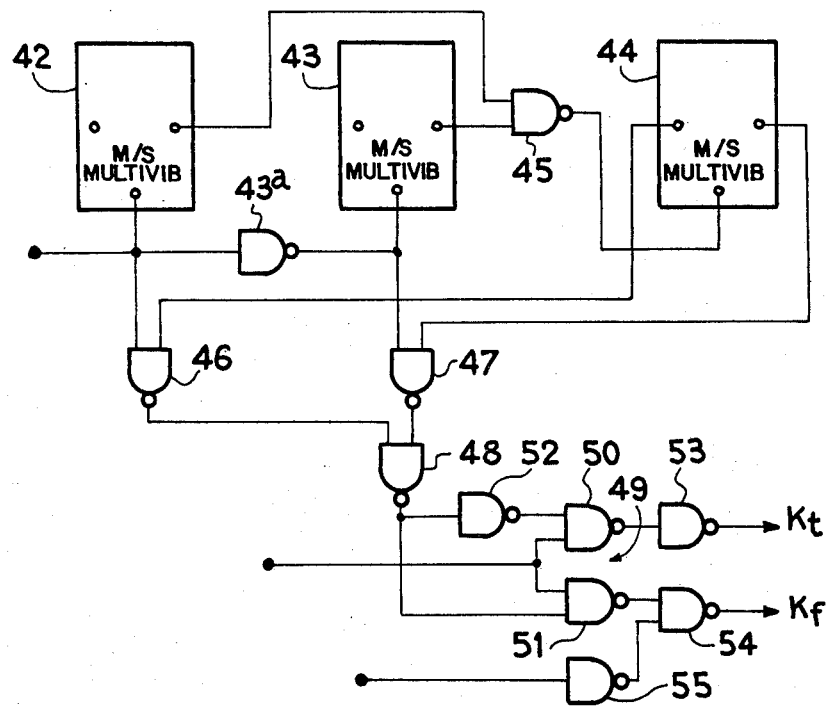
FIG. 5 shows the logic circuit controlling the switch contactors of the circuit shown in FIG. 1.

The logic circuit 10 controlling the switch 3 is shown in FIG. 5.

This circuit comprises three monostable circuits 42, 43 and 44. The input of the monostable circuit 42 constitutes the input of the logic circuit connected to the corresponding output of the time base circuit 12 of FIG. 1. This input is connected to the input of the monostable circuit 43 through an inverter 44. The outputs of the monostable circuits 42 and 43 are each connected to an input of an inverting AND gate 45 whose output is connected to the input of the monostable circuit 44. Two outputs of the monostable circuits 44 are respectively connected to the inputs of inverting AND gates 46 and 47 whose other inputs are respectively connected to the inputs of the monostable circuits 42 and 43. The outputs of the gates 46 and 47 are each connected to an input of an inverting AND gate 48 whose output is connected to an assembly of gates 49 which is also connected to the corresponding output of the circuit 14 controlling the cycling of FIG. 1. The assembly of gates 49 comprises two inverting AND gates 50, 51 whose first inputs are connected to the output of the circuit 14 controlling the cycling. Another input of the gate 50 is connected to the output of the gate 48 through an inverter 52, whereas the other input of the gate 51 is directly connected to the output of the gate 48. The output of the gate 50 is connected to an inverter 53 whose output constitutes the traction control output Kt of the inverter 3, whereas the output of the gate 51 is connected to an input of an inverting AND gate 54 whose other input is connected to an inverter 55 which constitutes the control input of the inverter for charging the battery. The output of the gate 54 constitutes the braking control output Kf of the inverter 3.

Figure 6:
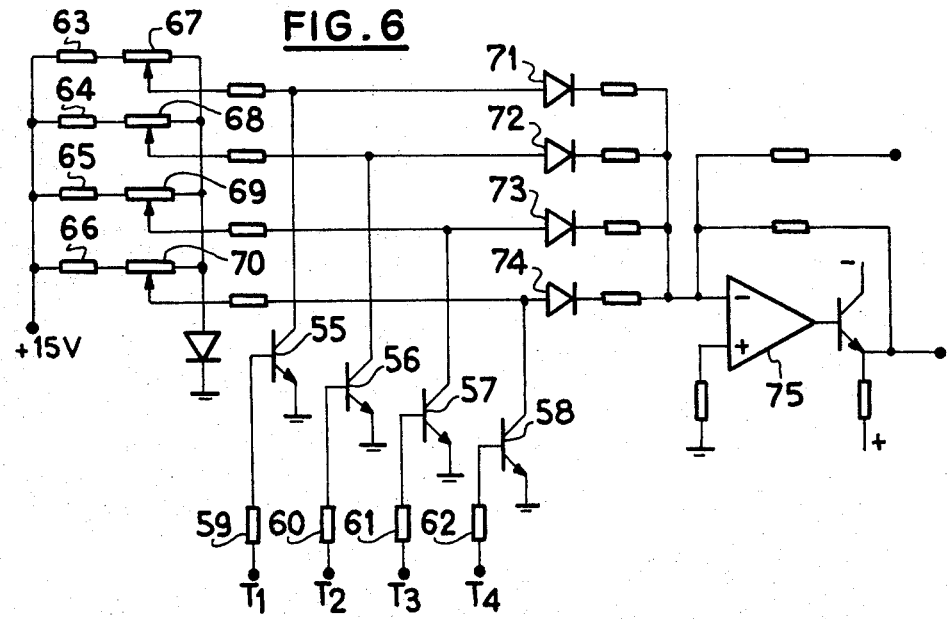
FIG. 6 shows the circuit controlling the rectifier-inverter of the circuit of FIG. 1.

The circuit 11 controlling the rectifier-inverter 4 of the simulator according to the invention is shown in FIG. 6.

This circuit comprises four input transistors 55 to 58 whose bases are connected to the inputs T1 to T4 through resistors 59 to 62. The emitter-collector paths of each of the transistors are connected to reference voltage circuits constituted by current dividers each comprising a resistor 63 to 67 in series with a potentiometer 66 to 70. The slide of each of the potentiometers is connected, through resistors of the same value and a diode 71 to 74, to the input of an operational amplifier 75. This input of the amplifier 75 constitutes the reference current of braking traction or of recharge adapted to be applied to the circuit 16 associated with the inverter 4 through the amplifier 75 adapted to deliver to the inverter the reference current having a correct power level.

Figure 7:
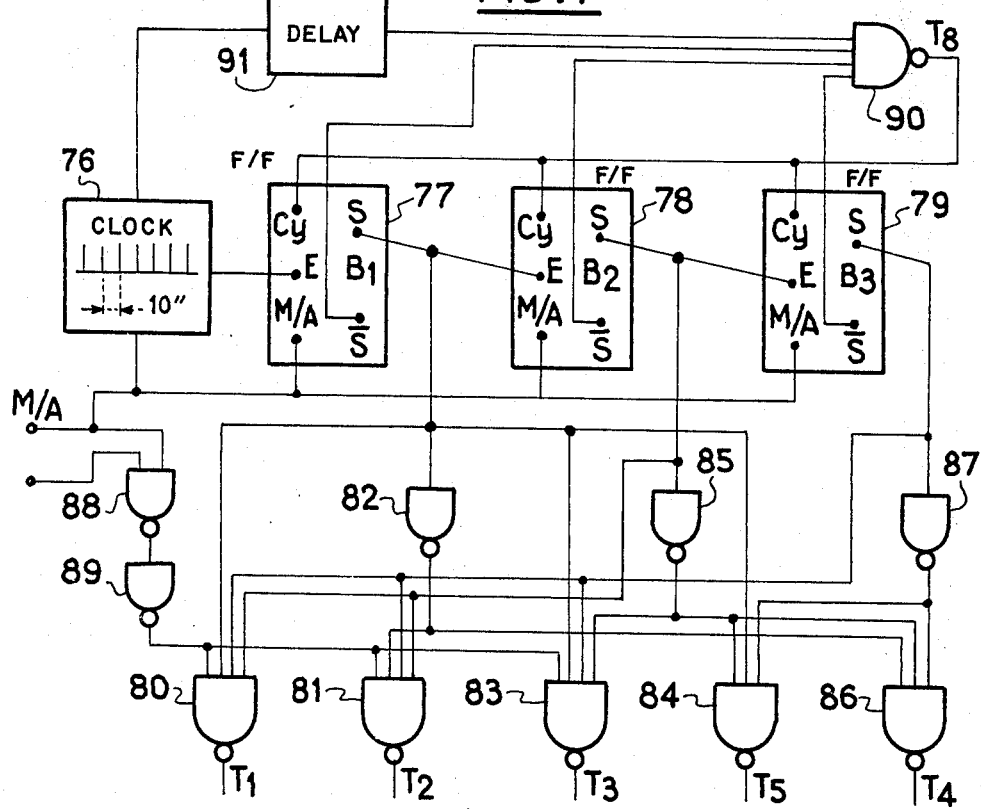
FIG. 7 shows the time base circuit of the circuit of FIG. 1.

The time base circuit 12 of the simulator of the invention is shown in FIG. 7.

This circuit comprises a clock 76 whose first output is connected to a flip-flop GK 77, which is connected to another flip-flop GK 78. The latter is connected to a third GK flip-flop 79. The non-inverting output of the flip-flop 77 is connected directly to a NAND gate 80 having four inputs, to an input of a NAND gate 81 having four inputs through an inverter 82, directly to a third NAND gate 83 having four inputs/and directly to a NAND gate 84 having three inputs.

The non-inverting output of the flip-flop 78 is connected directly to another input of the gates 80 and 81 and, through an inverter 85, to another input of the gates 83 and 84 and to an input of a NAND gate 86 having three additional inputs.

The non-inverting output of the flip-flop 79 is connected to a third input of each of the gates 80, 81 and 83 and, through an inverter 87, to the remaining inputs of the gates 84 and 86.

The clock 76 further comprises a start-stop input M/A which is connected to the respective start-stop inputs of the flip-flop 77, 78 and 79. This input of the clock 76 is connected to the start-stop input of the time base circuit which is itself connected to the circuit 14 controlling the cycling of the simulator. The start-stop input of the time base circuit is furthermore connected to an input of a NAND gate 88 whose other input constitutes the reference stop input of the circuit. The output of the gate 88 is connected to the fourth inputs of the gates 80, 81 and 83 through an inverter 89.

The inverting outputs of the flip-flops 77 to 79 are respectively connected to three inputs of a NAND gate 90 whose fourth input is connected to the output of the clock 76 through a delay circuit 91. The output of the gate 90 is connected to each of the control inputs of the flip-flops 77 to 79.

The outputs T1 to T5 of the gates 80, 81, 83, 86 constitute the outputs of the cycle defined by the time base and connected to the logic circuit 9 controlling the chopper, to the logic circuit 10 controlling the switch 3, and to the circuit controlling the rectifier-inverter.

Figure 9:
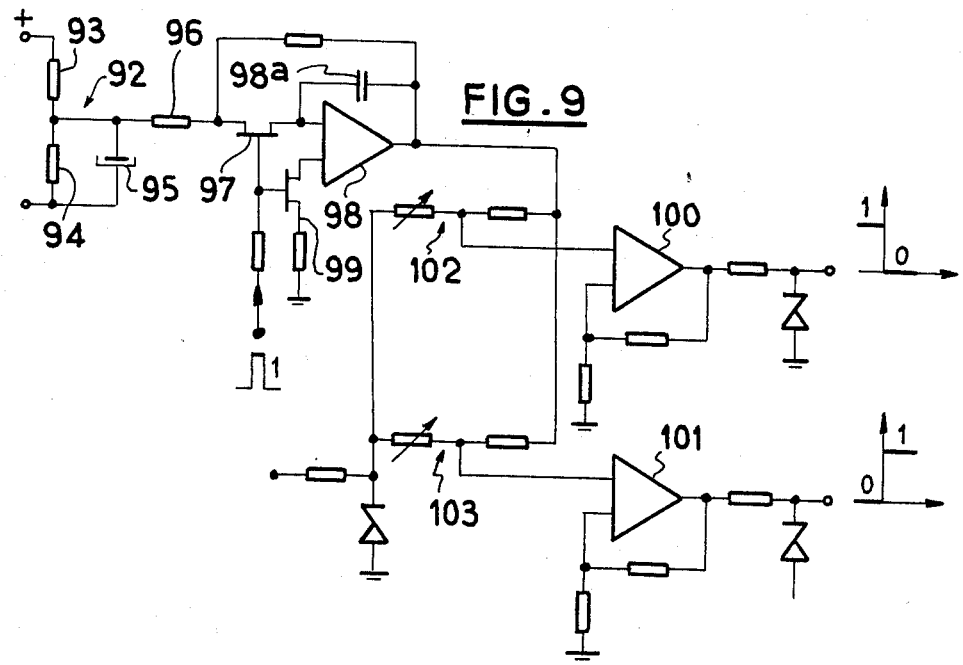
FIG. 9 is an electric schematic of the circuit supervising the state of charge of the battery.

The circuit supervising the state of charge of the battery 1 is shown in FIG. 9.

It comprises a voltage divider 92 constituted by two resistors 93 and 94 connected in series to the terminals of the battery 1. A capacitor 95 is connected in parallel with the resistor 94. The junction of the resistors 93 and 94 is connected, through a resistor 96 and the source-drain path of a field effect transistor 97, to an input of an amplifier 98 whose other input is connected to earth through the source-drain path of a field effect transistor 99. The gate electrodes of the transistors 97 and 99 are connected to a reading control input of the circuit. The amplifier 98 is adapted to store the value of the voltage of the battery between two successive cycles. The output of the amplifier 98 is connected to inputs of two comparators 100 and 101 through respective voltage dividers 102 and 103 which are supplied with current by a constant voltage source and are respectively regulated to give voltages one of which corresponds to 80% of the discharge of the battery and the other to 100% of the charge of the battery.

The outputs of the comparators 100 and 101 are connected to the corresponding inputs of the circuit 13 controlling the recharging 18 of the simulator of FIG. 1.

Figure 10:
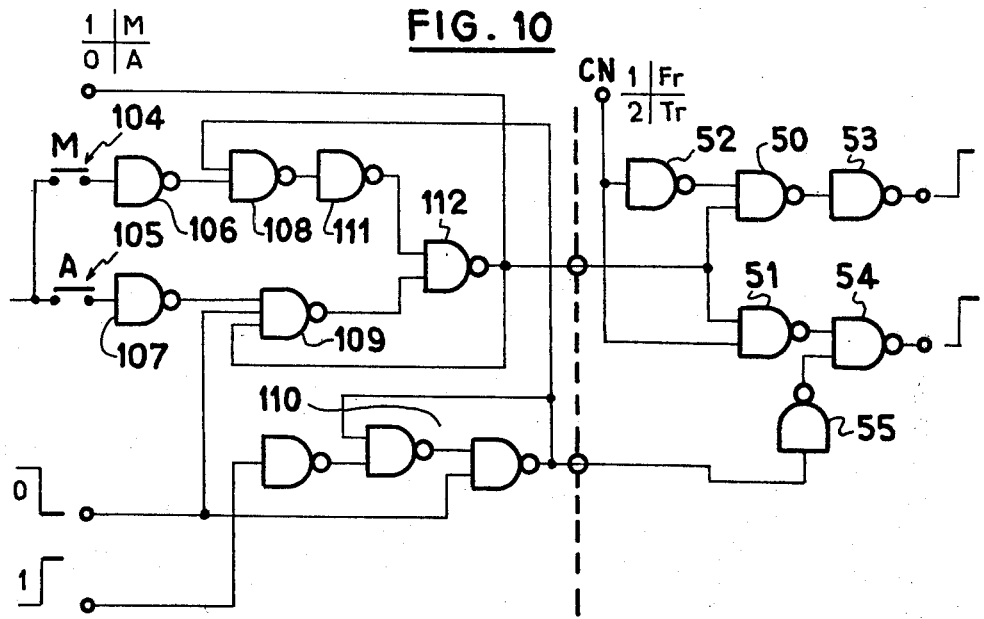
FIG. 10 is a circuit controlling the cycling of the circuit of FIG. 1.

The circuit controlling the cycling 14 is shown in FIG. 10.

It comprises mainly a START switch 104 and a STOP switch 105 which are respectively connected through inverters 106 and 107 respectively to an input of a NAND gate having two inputs 108 and to an input of a NAND gate having three inputs 109. Another input of the gate 109 is connected to the charge ouput of the supervising circuit of FIG. 9.

The circuit of FIG. 10 further comprises an additional input connected to the output relating to the end of the charging of the supervising circuit of FIG. 9, this input being connected through an assembly of gates 110 to the other input of the gate 108. The outputs of the gates 108 and 109 are connected respectively through an inverter 111 and directly to the inputs of a NAND gate 112 whose output is connected to the third input of the gate 109 and constitutes, furthermore, the control output connected to the time base circuit 12.

The output of the gate 112 and the output of the assembly of gates 110 are respectively connected to the common input of the gates 50 and 51 and to the input of the inverter 55 of the logic circuit controlling the inverter shown in FIG. 5.

The recharging control circuit 18 of the device of FIG. 1 is shown in FIG. 9.

In the presently-described embodiment, considered as being applied to a lead battery, this circuit comprises two amplifier stages 113, 114 which are connected in cascade. Connected to one of the inputs of the stage 113 through a potentiometer 115 is a source of voltage which defines the voltage $U_{max}$ of maximum charge of the battery to be tested. Moreover, this same input receives the instantaneous voltage $U_B$ of the battery. The output of the stage 113 is connected to the input of the stage 114 at the output of which there are connected, in series, two identical resistors 116 and the slide of a potentiometer 117 connected between a source of positive voltage and earth. The junction point of the resistors 116 is connected to the input of the amplifier 114 through a diode 118. The output of the amplifier stage 114 constitutes the output of the recharging reference current adapted to be applied to the control circuit 11 of the rectifier-inverter 4.

The operation of the simulator of the invention will now be described with reference to, in particular, FIGS. 2, 3 and 8.

The current of the battery of the operation of which on the vehicle the device according to the invention is adapted to simulate, flows between the three-phase supply mains for the rectifier inverter and the battery 1 in passing through the rectifier-inverter 4, the controlled electromechanical switch 3 and the direct current chopper 2.

The maximum amplitude of the current of the battery is always given by the current delivered by the rectifier-inverter. This current thereafter passes through the electromechanical switch 3.

In the case of the output of the battery corresponding to the simulated traction of a vehicle, this current passes through the battery 1 and returns to the rectifier-inverter 4 in passing through the thyristor $Th_1$ which is rendered conductive for this purpose.

On the other hand, when the battery 1 receives electric energy, for example in the course of the simulation of the braking of the vehicle with recovery of energy or in the course of the recharging of the battery, the current delivered by the rectifier-inverter 4 passing through the contacts 5 actuated by the relay 7 of the switch 3, passes through the diode $D_1$ of the chopper circuit 2, the battery 1, and returns to the rectifier-inverter 4.

The rectifier-inverter 4 is employed with controlled current I which is governed by a value $I_{ref}$. The instantaneous maximum value of the current of the battery is therefore fixed by this reference current.

The assembly formed by the rectifier-inverter 4 and the electromagnetic switch 3 is practically equivalent to a direct current electric motor operating as a motor or a generator, depending on whether there is a simulation of the driving or of the braking of the vehicle.

The chopper 2 operates in the following manner. When the battery is being discharged the turning on of the thyristor $Th_1$ causes the passage of a current I through the battery. The turning off of this thyristor causes this current I to pass through the diode $D_2$ and consequently cancels out the current circulating in the battery. The conduction and extinction times of the thyristor $Th_1$ consequently regulate the mean current of the battery and the mean output voltage of the rectifier-inverter 4.

When the battery 1 is being recharged, the current I normally passes through the diode $D_1$. The ignition of the thyristor $Th_2$ causes the passage of this current through this thyristor and consequently cancels out the current circulating in the battery. The conduction and extinction time of the thyristor $Th_2$ consequently regulates likewise the mean current of the battery and the mean output voltage of the rectifier-inverter 4. The form of the current delivered by the chopper to the terminals of the battery 1 is shown in FIG. 2.

This Figure clearly shows the conduction times of various elements necessary to obtain the simulation and acceleration followed by a braking with a maximum current I circulating in the battery corresponding to the current delivered to the motor, or produced by the latter, on a simulated vehicle. The assembly formed by the chopper 2 connected to the terminals of the battery 1, the switch 3 and the rectifier-inverter 4 must be brought into action to achieve a succession of cycles of simulated town circulation, each cycle comprising periods of acceleration, travelling on the level, braking, stoppage, until the discharge of the battery, it being necessary to thereafter recharge the battery under imposed conditions before proceeding to another cycle.

Figure 3:
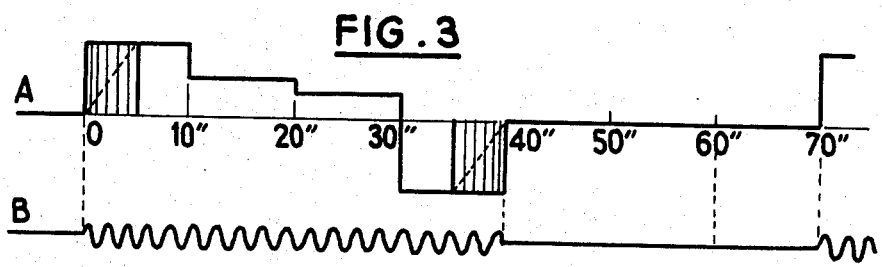
FIG. 3 is a diagram of the variation of the current of the battery in the course of the simulation of a circulation according to the Stockholm cycle.

If it is assumed, as mentioned before, that the device of the invention is intended to simulate the circulation of a vehicle in accordance with the Stockholm cycle, the graph of the current of the battery is given by the curve shown in FIG. 3.

This graph shows that the total duration of a cycle is 70 seconds, the last 30 seconds of a cycle corresponding to the stoppage of the vehicle. In the course of the first 10 seconds of the cycle, there is an acceleration of the vehicle and consequently an increase in the current supplied by the battery, in the course of the following 20 seconds, there is a simulation of a travelling of the vehicle on a level and, in the course of the 10 seconds preceding the stoppage period, there is a simulation of the braking with regeneration, that is to say restoration of a certain current to the battery.

The graph of FIG. 3 shows moreover that, during the entire part of the cycle during which there is a simulation of the operation of the vehicle, there is also an emission of a signal causing the mechanical vibration of the battery simulating the movements thereof on an actual vehicle.

The variation of the current of the battery in the course of a Stockholm cycle is represented by the curve A and the signal for producing the mechanical vibrations is represented by the curve B.

Figure 2:
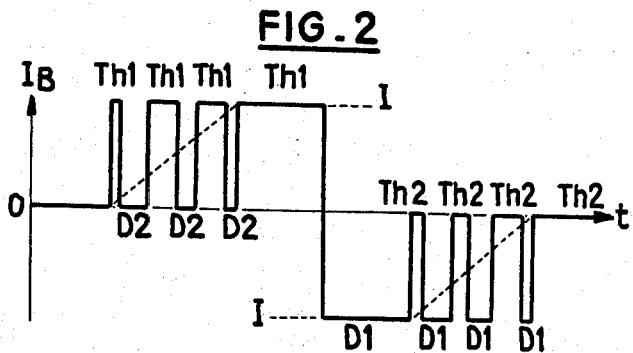
FIG. 2 is a diagram, with respect to time, of the conduction times of the various elements of the circuit of FIG. 1 required to obtain the simulation of an acceleration followed by a braking, with a maximum current I circulating in the battery.

The control of the operation of the assembly comprising the chopper 2, the switch 3 and the rectifier-inverter 4 for the purpose of causing the battery to supply a current conforming to that shown in FIG. 2 and in accordance with a cycle corresponding to that shown in FIG. 3, is ensured by the assembly of the circuits associated with the aforementioned assembly and shown in the drawings. The chopper 2 is controlled by the logic control circuit shown in FIG. 4. It concerns the switching on of the traction thyristor $Th_1$ and braking thyristor $Th_2$ of the chopper 2. The logic circuit 9 receives from the time base circuit 12 a traction order $T_1$ emitted by the clock 76 of the time base circuit. The signal $T_1$ is applied to the monostable circuit 20 which delivers a pulse having a duration of 5 seconds. This pulse is applied to the operational amplifier 27 which delivers at its output a voltage signal in phase opposition to the input pulse. This voltage signal, whose value is for example equal ±15 V, is applied to the operational amplifier 29 which delivers a voltage which varies linearly from 0 to a predetermined value, for example 10 V in 5 seconds, this variation being achieved by means of the RC circuit formed by the capacitor 30 and the resistor 28. The Zener diode 31 prevents the output voltage of the amplifier 29 from exceeding the aforementioned value of 10 V. When the output voltage of the amplifier 27 passes to its positive value of +15 V, the transistor 32 associated with the amplifier 29 becomes conductive and causes the quasi-instantaneous discharge of the capacitor 30 while maintaining the output voltage of the amplifier 29 at zero. The output signal of the amplifier 29 is applied to the inputs of the amplifiers 35 and 36 which operate in turn under the control of the switching means 37 which releases either the amplifier 35 or the amplifier 36, depending on whether it transmits the traction order $T_1$ or the braking order $T_4$ applied to the monostable circuit 20.

The operational amplifier 35 inverts the input function so that there appears at its output a voltage which varies linearly between 0 and a negative value equal to −10 V for example. The operational amplifier 36 delivers on the other hand the symmetrical function of the preceding function so that there appears at its output a voltage which varies linearly between a negative value, equal to −10 V for example, and zero.

The summing amplifier 38 makes the sum of the signals from the amplifiers 35 and 36 and its output voltage is compared with a sawtooth signal of amplitude equal to the extreme values of the voltages delivered by the amplifiers 35 and 36, that is to say ±10 V and of a frequency equal to 200 Hz. The output signal of the comparator 39 is applied to the gate 41 which delivers a signal for controlling the chopper for the purpose of causing the conduction or the blocking of the thyristors Th₁ and Th₂ of the latter.

When the output signal of the gate 41 is equal to 1, it causes the conduction of the thyristor Th₁ and when it is equal to 0, it causes the conduction of the thyristor Th₂. The sequence of operation of the switch 3 is controlled by the logic circuit 10 shown in FIG. 5.

This circuit receives at a first input connected to the time base circuit 12 and connected to the monostable circuit 42, a signal initiating the passage to traction of the logic level 1 or a signal for the passage to the braking of the logic level 0.

At its input connected to the circuit 14 controlling the cycling, the circuit of FIG. 5 receives a start signal of a logic level 1 or a stop signal of a logic level 0. As its input controlling charging operation, the circuit of FIG. 5 receives a signal also coming from the cycling control circuit of FIG. 10.

When the input signal coming from the time base circuit 12 is a signal initiating the passage to traction, the assembly formed by the monostable circuits 42 and 43, the inverter 44 and the gate 45, delivers a pulse having a width of 0.2 second which is converted by the monostable circuit 41 into a direct signal or an inverse signal having a width equal to 0.3 second.

These offset pulses, processed in the gates 46, 47 and 48, cause the excitation of the gate 50 and consequently the transmission of the signal Kt initiating the passage of the contacts of the inverter 33 to the traction position with a delay of 0.3 second at the instant of application by the cycling control circuit 14 of the start signal.

When the time base circuit 12 applies to the circuit of FIG. 5 a signal initiating the braking, the monostable circuits 42, 43 and 44 deliver, as before, signals of 0.2 sec and 0.3 second which, through the gates 48 cause the application of the braking initiating signal Kf to the inverter 3 and the interruption of the signal Kt.

In the stop position, the switch 3 is completely released and in the charging position an input signal applied to the gate 55 permits putting the switch 3 into the same position as the braking position, that is to say causing the closure of the contacts 6 by the relay 8 of said switch.

The signals coming from the outputs T1 to T4 of the time base circuit 12 and applied to the bases of the transistors 55 to 58 of the circuit controlling the rectifier-inverter 4 shown in FIG. 6, render these transistors successively conductive and successively release the voltage references set on the potentiometers 67 to 70. Consequently, the amplifier 75 delivers to the rectifier-inverter reference currents in accordance with the sequence defined by the time base circuit 12. Thus, the current delivered by the rectifier inverter varies in accordance with the pre-established cycle.

The time base circuit 12 shown in FIG. 7 will now be considered with reference to the diagram shown in FIG. 8. The clock 76 of this circuit delivers signals having a width of 10 microseconds every 10 seconds as shown by the line H of the diagram of FIG. 8. These signals are applied to the flip-flop JK 77 which supplies current to the flip-flop 78 which in turn supplies current to the flip-flop 79. The output signals of these three flip-flops, which appear on the lines B1, B2, B3 of the graph of FIG. 8, are combined by the gates 80 to 90 so that at the inputs T1 to T5 and T8 of these gates there appear in succession a pulse T1 which exists from 0 to 10 sec., a pulse T2 which exists from 10 to 20 sec., a pulse T3 which exists from 20 to 30 sec., a pulse T4 which exists from 30 to 40 sec., a pulse T5 which exists from 60 to 70 sec. and a short pulse T8 which appears after 70 sec. so as to recommence the cycle at zero. The start-stop signal M/A applied to the gate 88 of the time base circuit and coming from the circuit 14 controlling the cycling, ensures, when it is at level 0, the resetting of the three flip-flops 77 to 79 and the blocking of the clock 76. When this signal passes to the state 1, the clock is started again and the counting of the divider by 7 constituted by the three aforementioned flip-flops and the gate 90 starts again.

The supervision of the state of charge of the battery is ensured by the circuit of FIG. 9. The voltage of the battery 1 to be tested supplies current to the divider 92 which delivers at the point of junction of the resistors 93 and 94 a proportional voltage. The amplifier 98, the two field effect transistors 97 and 99 and the capacitor 98a connected between an input and the output of the amplifier 98 ensure the reading of this voltage during the duration of the signal T1 applied to the control electrodes of the transistors 97 and 99 and delivered by the cycling control circuit 14. There is moreover a storage of the value of the voltage of the battery which may be read between two successive cycles at the output of the amplifier 98. This voltage is compared by the comparator 100 with a voltage corresponding to the maximum contemplated discharge state embodied by the voltage added to the output voltage of the amplifier 98 by a voltage divider comprising the potentiometer 102. The signal T1 is positioned in the cycle in such manner that the voltage measured by the supervising circuit validly gives the discharged battery information.

For example, in the case of a lead battery, the signal T1 is applied to the circuit when the simulation device has been at rest, at zero current, for 20 sec.

During the battery recharging period, the order embodied by the signal T1 is permanent. The output voltage $U_{BM}$ of the amplifier 98 follows the voltage of the battery and is then compared by the comparator circuit 101 with a voltage corresponding to a 100% charge of the battery delivered by the divider comprising the potentiometer 103. As soon as the recharging of the battery has finished, the value of 100% is reached and the comparator 101 delivers at its output a signal corresponding to an order to stop the charging of the battery and to recommence a new simulation cycle.

Figure 11:
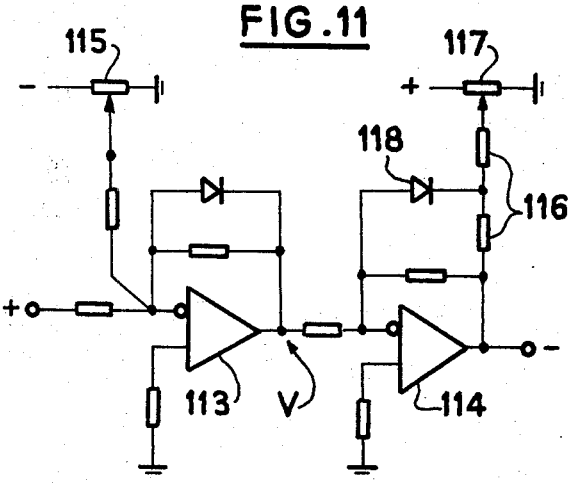
FIG. 11 shows a circuit controlling the recharging of the battery.

The recharging control circuit of FIG. 11 receives the signals coming from the supervising circuit of FIG. 9.

As this circuit has detected the necessity to recharge the battery, the rectifier-inverter 4 delivers the current required to recharge the battery, whereas the contacts of the switch 3 are automatically shifted to the braking position. The rectifier-inverter 4 then operates as a charger and the reference current received by the circuit 11 controlling the rectifier-inverter is delivered by the recharging control circuit 18. Depending on the type of battery employed, the relation battery voltage/battery current is different. The circuit of FIG. 11 is intended to be employed in the case of a lead battery. When the voltage of the battery $U_B$ applied to the input of the amplification stage 113 of this circuit is lower then the maximum voltage $U_{Bmax}$, the output potential of the stage 113 is positive and determined by the gain A1 of this stage. This positive potential gives at the output of the stage 114 a negative potential which is compared by the identical resistors 116 with the image value $I_{max}$. The difference is applied by the diode 118 to the input of the amplifier stage 114. Equilibrium is obtained when the reference current is equal and of opposite sign to the maximum set reference. The recharging is consequently effected at a quasi constant voltage practically equal to the set value.

The cycling control circuit shown in FIG. 10 receives on its two contacts 104 and 105 the manual start or stop orders. The gates 109 and 112 store these orders and deliver the control signals to the time base circuit 12 at the output of the gate 112. These gates moreover ensure the blocking of the switch 3 of the simulator of FIG. 1. The order to start the recharging, coming from the charge supervising circuit 17 and applied to the gate assembly 110, is stored in this assembly. This gate/assembly ensures, on one hand, the control of the cycling by the gate 108 and, on the other hand, the setting of the switch 3 at such position as to allow the rectifier-inverter 4 to ensure the recharging of the battery.

The simulator of the operation of an accumulator battery which has just been described has, by its very construction, the advantage of being in the condition of permanent energy exchange with the electric supply mains or line, which consequently receives in return the simulated energies of the traction of the vehicle.

Although in the present description the simulator of the invention has been considered as being applied to an accumulator battery for the traction of an electric vehicle, this simulator may be used for testing accumulator batteries intended for applications which are very different from that contemplated.

For this purpose, it is sufficient to adapt the control circuits of the simulator to the charging and discharging cycles to which the accumulator batteries are desired to be subjected as a function of their conditions of use.

Having now described our invention what we claim as new and desire to secure by Letters Patent is:

1. A device for simulating the operation of an accumulator battery, comprising an electric supply device for connection to a source of alternating current, said supply device comprising a rectifier-inverter for connection to said source and for connection to the battery for delivering a charging current to the battery in the course of the battery charging periods and for restoring to said source a discharge current of the battery in the course of the battery discharging periods, the simulating device further comprising a direct current chopper circuit adapted to chop at a variable conduction rate selectively the current received by the battery and the current delivered by the battery in the course of the simulation of a cycle of operation of the battery, and a switch connected between the rectifier-inverter and the chopper circuit for causing the passage of a charging current from the rectifier-inverter to the battery in the course of the battery charging periods and the passage of a discharge current from the battery to the rectifier-inverter and the source during the battery discharging periods.

2. A device as claimed in claim 1, further comprising a logic circuit connected to the chopper circuit to control the chopper circuit in accordance with a predetermined sequence corresponding to a cycle of simulation that it is desired to impose on the current circulating in the battery.

3. A device as claimed in claim 1 or 2, further comprising a logic circuit connected to the switch to control the switch as a function of the sequence of simulation of the battery charging and discharging periods.

4. A device as claimed in claim 1, further comprising a control circuit connected to control the rectifier-inverter for causing the rectifier-inverter to deliver a current corresponding to predetermined reference currents in the course of the various periods of simulation of the charging of the battery and for causing it to operate as an inverter in the course of the periods of simulation of the discharging of the battery.

5. A device as claimed in claim 2, further comprising a logic circuit connected to the switch to control the switch as a function of the sequence of simulation of the battery charging and discharging periods, a control circuit connected to control the rectifier-inverter for causing the rectifier-inverter to deliver a current corresponding to predetermined reference currents in the course of the various periods of simulation of the charging of the battery and for causing it to operate as an inverter in the course of the periods of simulation of of the discharging of the battery, a control circuit ensuring the supervision of the state of charge of the battery and a time base circuit connected between said state of charge supervision control circuit and the logic circuit controlling the chopper, the logic circuit controlling the switch and the circuit controlling the rectifier-inverter so as to ensure the sequential control of these circuits as a function of the state of charge of the battery and manual start and stop instructions.

6. A device as claimed in claim 5, wherein said time base circuit has a traction output and a braking output, said logic circuit controlling the direct current chopper comprises a monostable circuit having an input which is connected through a gate to the traction output and to the braking output of said time base circuit and outputs which are each connected, through an inverting AND gate controllable by a corresponding inverted input signal, to a circuit generating a voltage which varies linearly in the course of an interval of time defined by the monostable circuit and the inverting AND gates through which it is connected to said generating circuit, the device further comprising two amplifiers, switching means connected to control the two amplifiers, the generating circuit having an output connected to the two amplifiers, the monostable circuit having an output connected to the switching means through one of the gates connecting the monostable circuit to said generating circuit so as to transmit selectively the traction order and the braking order applied to the inputs of the logic circuit controlling the chopper, summing means, a comparator, the amplifiers having outputs connected through the summing means to the comparator, the comparator being capable of comparing the signals of the outputs of the amplifiers with a sawtooth signal of amplitude equal to the amplitude of said signals and of predetermined frequency delivered by a generator.

7. A device as claimed in claim 5, wherein the logic circuit controlling the switch comprises a first monostable circuit, a second monostable circuit and a third monostable circuit, the first monostable circuit having an input connected to a corresponding output of the time base circuit, the second monostable circuit having an input connected to the same output of the time base circuit through an inverter, and the third monostable circuit having an input connected to outputs of the first and second monostable circuits through a first NAND gate, second and third NAND gates connected for combining the input signals of said first and second monostable circuits with an output signal of the third monostable circuit and its opposite signal respectively, a fourth NAND gate connected for combining the output signals of said second and third NAND gates, the output of said fourth gate being connected to an assembly of gates which assembly is also connected to an output of the control circuit for supervising the state of charge of the battery, said assembly of gates being capable of producing selectively a traction order signal and a braking order signal to be applied to said switch.

8. A device as claimed in claim 6, wherein said circuit controlling said rectifier-inverter comprises an operational amplifier, transistors, and a number of reference voltage circuits adapted to the number of reference currents which said rectifier-inverter must receive in the course of a cycle of operation of the simulator, said reference voltage circuits being connected to the corresponding outputs of the time base circuit through corresponding ones of said transistors and connected to an input of the operational amplifier which is for sequentially delivering the reference currents to said rectifier-inverter.

9. A device as claimed in claim 7, wherein said circuit controlling said rectifier-inverter comprises an operational amplifier, transistors, and a number of reference voltage circuits adapted to the number of reference currents which said rectifier-inverter must receive in the course of a cycle of operation of the simulator, said reference voltage circuits being connected to the corresponding outputs of the time base circuit through corresponding ones of said transistors and connected to an input of the operational amplifier which is for sequentially delivering the reference currents to said rectifier-inverter.

10. A device as claimed in any one of the claims 5 to 9, wherein said time base circuit comprises a clock, the clock having an input, the control circuit for supervising the state of charge of the battery having a start-stop output connected to the input of the clock, a divider of signals of the clock, and an assembly of gates for producing sequentially from output signals of the divider, signals of the clock and control signals coming from said control circuit for supervising the state of charge of the battery, signals for synchronizing the various circuits of the device.

11. A device as claimed in claim 10, wherein said divider circuit comprises a first JK flip-flop, a second JK flip-flop and a third JK flip-flop connected in cascade to the clock, said JK flip-flops having inputs connected with the input of said clock, to the start-stop control output of said control circuit for supervising the state of charge of the battery, said JK flip-flops having inverting outputs each connected to an input of a NAND gate having four inputs the fourth input of which NAND gate is connected to said clock through a delay circuit, the NAND gate having an output connected to control inputs of the JK flip-flops.

12. A device as claimed in claim 5, wherein said control circuit for supervising the state of charge of the battery comprises a state of charge supervising circuit, a circuit controlling the recharge which is connected to the state of charge supervising circuit and connected to said circuit controlling the rectifier-inverter and to a circuit controlling the cycling which is connected to the time base circuit.

13. A device as claimed in claim 12, wherein said state of charge supervising circuit comprises a voltage divider connected to the terminals of said battery, an amplifier for reading and storing the voltage of the battery between two successive cycles and having an input connected to the voltage divider, a circuit connected for initiating said amplifier upon the reception of a reading pulse and a unit for comparing the voltage of the battery with a voltage corresponding to a predetermined pourcentage of discharge of the battery and with a voltage corresponding to the full charge of the battery, said amplifier having an output connected to said unit.

14. A device as claimed in claim 12, wherein said circuit controlling the charging comprises a first amplifier stage, an adjustable source of voltages defining the maximum charge voltage of the battery to be supervised, a current limiting circuit, and a second amplifier stage having an output which defines, in combination with the current limiting circuit, the reference current of recharging to be applied to the rectifier-inverter, the first amplifier stage having an input which is connected to the adjustable source of voltage and receives the instantaneous voltage of the battery.

15. A device as claimed in claim 13, wherein said circuit controlling the charging comprises a first amplifier stage, an adjustable source of voltages defining the maximum charge voltage of the battery to be supervised, a current limiting circuit, and a second amplifier stage having an output which defines, in combination with the current limiting circuit, the reference current of recharging to be applied to the rectifier-inverter, the first amplifier stage having an input which is connected to the adjustable source of voltage and receives the instantaneous voltage of the battery.

16. A device as claimed in any one of the claims 12 to 15, wherein said circuit for controlling the cycling comprises an assembly of gates for combining start and stop signals which it receives from manual control switches with the output signals of the circuit for supervising the state of charge of the battery for the purpose of controlling the time base circuit and controlling the logic circuit controlling the switch.

* * * * *